United States Patent
Kobayashi et al.

(10) Patent No.: US 11,831,296 B2
(45) Date of Patent: Nov. 28, 2023

(54) PIEZOELECTRIC VIBRATOR ELEMENT, PIEZOELECTRIC VIBRATOR, OSCILLATOR, AND METHOD OF MANUFACTURING PIEZOELECTRIC VIBRATOR ELEMENT

(71) Applicant: SII Crystal Technology Inc., Chiba (JP)

(72) Inventors: Takashi Kobayashi, Chiba (JP); Motoki Shibuya, Chiba (JP); Chisato Ojima, Chiba (JP); Tomohiro Momose, Chiba (JP)

(73) Assignee: SII CRYSTAL TECHNOLOGY INC., Chiba (JP)

( * ) Notice: Subject to any disclaimer, the term of this patent is extended or adjusted under 35 U.S.C. 154(b) by 0 days.

(21) Appl. No.: 17/534,913

(22) Filed: Nov. 24, 2021

(65) Prior Publication Data
US 2022/0173717 A1    Jun. 2, 2022

(30) Foreign Application Priority Data
Nov. 30, 2020  (JP) ................... 2020-197859

(51) Int. Cl.
*H03B 5/32* (2006.01)
*H03H 9/215* (2006.01)
(Continued)

(52) U.S. Cl.
CPC .............. *H03H 9/19* (2013.01); *H03B 5/32* (2013.01); *H03H 3/04* (2013.01); *H03H 9/0595* (2013.01);
(Continued)

(58) Field of Classification Search
CPC ........ H01L 41/02; H01L 41/04; H01L 41/047; H01L 41/08; H01L 41/0805;
(Continued)

(56) References Cited

U.S. PATENT DOCUMENTS

| 2010/0244989 A1* | 9/2010 | Furuhata | H03H 9/215 |
| | | | 333/197 |
| 2010/0320875 A1* | 12/2010 | Takizawa | H03H 9/176 |
| | | | 310/357 |

(Continued)

FOREIGN PATENT DOCUMENTS

JP    2013-118652 A    6/2013

*Primary Examiner* — Levi Gannon
(74) *Attorney, Agent, or Firm* — Crowell & Moring LLP

(57) ABSTRACT

There is provided a piezoelectric vibrator element which is excellent in vibration characteristics, high in quality, and capable of suppressing a frequency fluctuation after a frequency adjustment. The piezoelectric vibrator element is provided with a piezoelectric plate having a pair of vibrating arm parts, an electrode film disposed on obverse and reverse surfaces of the piezoelectric plate, and weight metal films for a frequency adjustment disposed on the electrode film at the obverse surface side in the vibrating arm parts. The reverse surface of the vibrating arm part has a reverse side exposure part from which the piezoelectric plate is exposed. The obverse surface of the vibrating arm part has an obverse side exposure part from which the weight metal film and the electrode film are removed, and from which the piezoelectric plate is exposed. A whole of the obverse side exposure part overlaps the reverse side exposure part at a distance from the electrode film on the reverse surface viewed from a thickness direction of the piezoelectric plate.

11 Claims, 10 Drawing Sheets

(51) Int. Cl.
  *H03H 9/19*   (2006.01)
  *H03H 3/04*   (2006.01)
  *H03H 9/05*   (2006.01)
  *H03H 9/13*   (2006.01)
  *H03H 9/10*   (2006.01)
(52) U.S. Cl.
  CPC ............ *H03H 9/105* (2013.01); *H03H 9/132* (2013.01); *H03H 9/215* (2013.01); *H03H 2003/0428* (2013.01); *H03H 2003/0442* (2013.01)
(58) Field of Classification Search
  CPC ..... H01L 41/083; H01L 41/09; H01L 41/094; H01L 41/18; H03B 5/30; H03B 5/32; H03H 3/04; H03H 9/0595; H03H 9/132; H03H 9/19; H03H 9/21; H03H 9/215; H03H 9/2468; H03H 9/2473; H03H 9/2478; H03H 9/2484; H03H 2003/0428; H03H 2003/022; H03H 2003/0421; H03H 2003/0442; H03H 2003/0492
  See application file for complete search history.

(56) References Cited

U.S. PATENT DOCUMENTS

| | | | |
|---|---|---|---|
| 2011/0025166 A1* | 2/2011 | Aratake | H03H 9/21 29/25.35 |
| 2012/0248938 A1* | 10/2012 | Kawanishi | H03H 9/0595 310/370 |
| 2013/0020915 A1* | 1/2013 | Sakamoto | H03H 9/0519 310/370 |
| 2015/0180449 A1* | 6/2015 | Umeda | H03H 9/02448 29/25.35 |
| 2015/0188514 A1* | 7/2015 | Yamada | H03H 9/0547 310/370 |
| 2015/0188515 A1* | 7/2015 | Yamada | H03H 9/02102 331/156 |
| 2020/0153408 A1* | 5/2020 | Fujii | H03H 9/21 |

* cited by examiner

PIEZOELECTRIC VIBRATOR ELEMENT, PIEZOELECTRIC VIBRATOR, OSCILLATOR, AND METHOD OF MANUFACTURING PIEZOELECTRIC VIBRATOR ELEMENT

RELATED APPLICATIONS

This application claims priority to Japanese Patent Application No. 2020-197859, filed on Nov. 30, 2020, the entire content of which is incorporated herein by reference.

BACKGROUND OF THE INVENTION

1. Field of the Invention

The present disclosure relates to a piezoelectric vibrator element, a piezoelectric vibrator, an oscillator, and a method of manufacturing a piezoelectric vibrator element.

2. Description of the Related Art

For example, in the electronic apparatus such as a cellular phone or portable information terminal equipment, a piezoelectric vibrator using a quartz crystal or the like is used as a device used for a clock time source, a timing source for a control signal and so on, a reference signal source, and so on. As a piezoelectric vibrator of this kind, there has been known a device having a piezoelectric vibrator element hermetically encapsulated in a package provided with a cavity.

The piezoelectric vibrator element described above is provided with a piezoelectric plate having a base part and a pair of vibrating arm parts extending in parallel to each other from the base part, and excitation electrodes disposed on outer surfaces of the respective vibrating arm parts. In the piezoelectric vibrator element, by a voltage being applied to the excitation electrodes, the vibrating arm parts vibrate with a predetermined resonant frequency in directions of getting closer to and away from each other using base end portions (connection portions with the base part) as the respective supporting points.

Here, as a method of adjusting the frequency of the piezoelectric vibrator element (the vibrating arm parts), there is a method of forming a weight metal film in advance in a tip portion of each of the vibrating arm parts, and adjusting the mass of the weight metal film by partially removing (trimming) the weight metal films to thereby perform the adjustment so that the frequency of the vibrating arm parts becomes a target value.

For example, in JP-A-2013-118652 (Document 1), there is disclosed a configuration in which the weight metal film is irradiated with a laser beam to partially eliminate the weight metal film to perform a coarse adjustment of the resonant frequency, and then the weight metal film is irradiated with an ion beam to perform a fine adjustment of the resonant frequency.

However, on the outer surface of the vibrating arm part, there is disposed an electrode film having the same film structure as that of the excitation electrode besides the weight metal film. Therefore, when performing the trimming of the weight metal film using the laser beam as in Document 1 described above, the laser beam entering the piezoelectric plate from which the weight metal film is removed is transmitted through the piezoelectric plate. Thus, the electrode film disposed at the opposite side to the weight metal film is irradiated with the laser beam, and there is a possibility that the irradiated portion of the electrode film is removed, and at the same time, a burr occurs at an end edge of a residual part of the electrode film. Further, when the burr described above makes contact with a package to thereby be separated or deformed, there arises a problem that the frequency having been adjusted by the trimming varies.

Therefore, the present disclosure provides a piezoelectric vibrator element, a piezoelectric vibrator, an oscillator, and a method of manufacturing a piezoelectric vibrator element in which a frequency fluctuation after the frequency adjustment is suppressed, and which are excellent in vibration characteristic, and are high in quality.

SUMMARY OF THE INVENTION

A piezoelectric vibrator element according to the present disclosure includes a piezoelectric plate having a pair of vibrating arm parts, an electrode film disposed on obverse and reverse surfaces of the piezoelectric plate, and a weight metal film for a frequency adjustment disposed at an obverse surface side in the vibrating arm part, and on the electrode film, wherein a reverse surface of the vibrating arm part has a reverse side exposure part from which the piezoelectric plate is exposed, the obverse surface of the vibrating arm part has an obverse side exposure part from which the weight metal film and the electrode film are removed, and from which the piezoelectric plate is exposed, and a whole of the obverse side exposure part overlaps the reverse side exposure part at a distance from the electrode film on the reverse surface viewed from a thickness direction of the piezoelectric plate.

According to the present disclosure, the laser beam transmitted through the piezoelectric plate passes through the reverse side exposure part when the obverse side exposure part is formed in the process of removing the weight metal film together with the electrode film as the lower layer of the weight metal film using the laser as the frequency adjustment. Therefore, since the electrode film on the reverse surface of the piezoelectric plate is not irradiated with the laser beam, it is possible to prevent the burr from occurring in the electrode film at the reverse surface side. Therefore, it is possible to prevent the fluctuation of the frequency due to the separation or the deformation of the burr of the electrode film. Therefore, it is possible to provide a piezoelectric vibrator element which is excellent in vibration characteristics, high in quality, and capable of suppressing a frequency fluctuation after a frequency adjustment.

In the piezoelectric vibrator element described above, it is possible that the electrode film is disposed on an end surface of the vibrating arm part on a periphery of the obverse side exposure part.

Although the weight metal film can be formed so as to warp around the end surface of each of the vibrating arm parts when depositing the weight metal film, according to the present disclosure, the electrode film on the end surface of the vibrating arm part functions as a foundation of the weight metal film to enhance the adhesiveness of the weight metal film compared to when the end surface of the vibrating arm part is exposed. Therefore, it is possible to prevent the separation of the weight metal film. Therefore, it is possible to prevent the fluctuation of the frequency due to the separation of the weight metal film. Therefore, the fluctuation of the frequency after the frequency adjustment can be suppressed.

In the piezoelectric vibrator element described above, it is possible that the reverse surface of the vibrating arm part is provided with a tip edge at a tip side in the vibrating arm part, and a pair of side edges extending from the tip edge toward a base end of the vibrating arm part, and the reverse side exposure part includes the tip edge and the side edges in the reverse surface of the vibrating arm part.

When the reverse side exposure part does not supposedly include the tip edge and the side edge of the reverse surface of the vibrating arm part, the entire outline of the reverse side exposure part coincides with the end edge of the electrode film on the reverse surface. In this case, it is necessary to remove the weight metal film located inside the outline of the reverse side exposure part in the plan view and at the obverse surface side. In the present disclosure, the end edge of the electrode film on the reverse surface does not exist in a portion coinciding with the tip edge and the side edge of the reverse surface of the vibrating arm part out of the outline of the reverse side exposure part. Therefore, even when the weight metal film on the tip edge and the side edge of the obverse surface of the vibrating arm part is removed, it is possible to prevent the electrode film on the reverse surface from being irradiated with the laser beam transmitted therethrough. Therefore, it becomes possible to increase the proportion of the area of the obverse side exposure part to the area of the reverse side exposure part compared to when the reverse side exposure part does not include the tip edge and the side edge of the reverse surface. Therefore, it is possible to set the adjustment range of the frequency wider. Further, since it is possible to remove the weight metal film in sequence from the tip toward the base end of the vibrating arm part, it is possible to efficiently perform the frequency adjustment.

In the piezoelectric vibrator element described above, it is possible that a portion disposed on the reverse surface of the vibrating arm part out of the electrode film straddles an end edge at the base end side in the vibrating arm part in the weight metal film viewed from the thickness direction.

According to the present disclosure, in the piezoelectric vibrator element having the excitation electrodes disposed at the base end side of the weight metal film, it is possible to form an interconnection coupled to the excitation electrodes using the electrode film so as to overlap the weight metal film in the plan view. Therefore, even when the proportion of the range occupied by the weight metal film increases as the piezoelectric vibrator element is reduced in size, it is possible to surely form the interconnection coupled to the excitation electrode to ensure the reliability.

A piezoelectric vibrator according to the present disclosure includes the piezoelectric vibrator element described above, and a package configured to airtightly seal the piezoelectric vibrator element.

According to the present disclosure, since the piezoelectric vibrator element described above is provided, it is possible to realize the piezoelectric vibrator excellent in operation reliability and high in quality.

An oscillator according to the present disclosure includes the piezoelectric vibrator, wherein the piezoelectric vibrator is electrically coupled to an integrated circuit as an oscillator.

According to the present disclosure, since the piezoelectric vibrator element described above is provided, it is possible to realize the oscillator excellent in operation reliability and high in quality.

A method of manufacturing a piezoelectric vibrator element according to the present disclosure includes an electrode film formation step of disposing an electrode film on obverse and reverse surfaces of a piezoelectric plate having a pair of vibrating arm parts, and forming a reverse side exposure part from which the piezoelectric plate is exposed on the reverse surface of the vibrating arm part, a metal film formation step of depositing a weight metal film on the electrode film at the obverse surface side in the vibrating arm part so that at least a part of the weight metal film overlaps the reverse side exposure part viewed from a thickness direction of the piezoelectric plate, and a trimming step of removing the weight metal film and the electrode film within a range overlapping the reverse side exposure part viewed from the thickness direction, and at a distance from the electrode film on the reverse surface at the obverse surface side in the vibrating arm part.

According to the present disclosure, since the laser beam transmitted through the piezoelectric plate passes through the reverse side exposure part in the trimming step, it is possible to prevent the electrode film at the reverse surface side in the vibrating arm part from being irradiated with the laser beam to form the burr. Therefore, it is possible to prevent the fluctuation of the frequency due to the separation or the deformation of the burr of the electrode film. Therefore, it is possible to manufacture the piezoelectric vibrator element which is excellent in vibration characteristics, high in quality, and capable of suppressing the fluctuation of the frequency after the frequency adjustment.

In the method of manufacturing a piezoelectric vibrator element described above, it is possible that one of a picosecond laser and a femtosecond laser is used in the trimming step.

According to the present disclosure, unlike the case of using the nanosecond laser, it is possible to prevent the burr from being formed in the electrode film and the weight metal film at the obverse surface side in the vibrating arm part.

In the method of manufacturing a piezoelectric vibrator element described above, it is possible that the electrode film formation step includes an electrode film deposition step of depositing the electrode film, and a patterning step of patterning the electrode film to form an excitation electrode and the reverse side exposure part.

According to the present disclosure, it is possible to form the reverse side exposure part with substantially the same processing accuracy as that of the excitation electrodes. Further, since the step for forming the reverse side exposure part is not added to the related-art manufacturing method, it is possible to suppress a rise in manufacturing cost.

In the method of manufacturing a piezoelectric vibrator element described above, it is possible that in the electrode film formation step, the electrode film is deposited in a state in which a part of the reverse surface of the vibrating arm part is masked to form the reverse side exposure part with the part.

According to the present disclosure, it is possible to form the reverse side exposure part when depositing the electrode film. Therefore, since the step for forming the reverse side exposure part is not added to the related-art manufacturing method, it is possible to suppress a rise in manufacturing cost.

According to the present disclosure, it is possible to provide a piezoelectric vibrator element, a piezoelectric vibrator, an oscillator, and a method of manufacturing a piezoelectric vibrator element in which a frequency fluctuation after the frequency adjustment is suppressed, and which are excellent in vibration characteristic, and are high in quality.

DETAILED DESCRIPTION OF THE PREFERRED EMBODIMENTS

Some embodiments of the present disclosure will hereinafter be described based on the drawings. It should be noted that in the following description, constituents having the same functions or similar functions are denoted by the same reference symbols. Further, the redundant descriptions of those constituents are omitted in some cases.

(Oscillator According to Embodiment)

Figure 1:
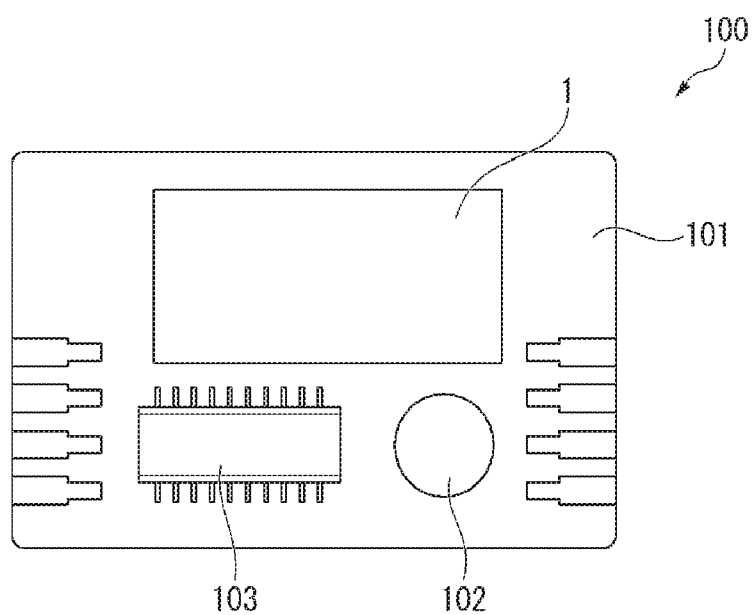
FIG. 1 is a diagram showing an oscillator according to an embodiment.

FIG. 1 is a diagram showing an oscillator according to the embodiment.

As shown in FIG. 1, the oscillator 100 is provided with a board 101, an electronic component 102, an integrated circuit 103, and a piezoelectric vibrator 1. The electronic component 102 is, for example, a capacitor, and is mounted on the board 101. The integrated circuit 103 is for the oscillator, and is mounted on the board 101. The integrated circuit 103 is electrically coupled to each of the piezoelectric vibrator 1 and the electronic component 102 via interconnections not shown. The piezoelectric vibrator 1 is mounted, for example, in the vicinity of the integrated circuit 103 in the board 101. The piezoelectric vibrator 1 functions as an oscillator. The piezoelectric vibrator 1 will be described later. At least a part of the oscillator 100 can arbitrarily be molded with resin not shown.

In the oscillator 100, when the piezoelectric vibrator 1 is supplied with the power, a piezoelectric vibrator element 3 (see FIG. 5) of the piezoelectric vibrator 1 vibrates. The vibration of the piezoelectric vibrator element 3 is converted into an electric signal by a piezoelectric characteristic provided to the piezoelectric vibrator element 3. The electric signal is output from the piezoelectric vibrator 1 to the integrated circuit 103. The integrated circuit 103 executes a variety of processes on the electric signal output from the piezoelectric vibrator 1 to thereby generate a frequency signal.

The oscillator 100 can be applied to, for example, a single-function oscillator for a time piece, a timing control device for controlling an operation timing of a variety of devices such as a computer, and a device for providing time or a calendar. The integrated circuit 103 is configured in accordance with a function required to the oscillator 100, and can include a so-!called an RTC (real-time clock) module.

(Piezoelectric Vibrator According to Embodiment)

Figure 2:
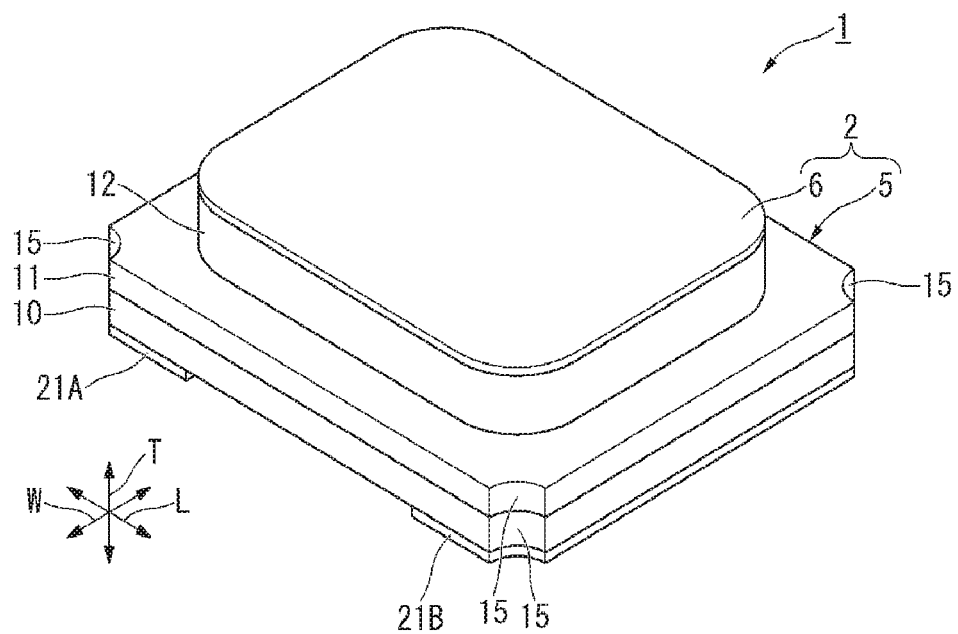
FIG. 2 is an exterior perspective view of a piezoelectric vibrator according to the embodiment.
Figure 3:
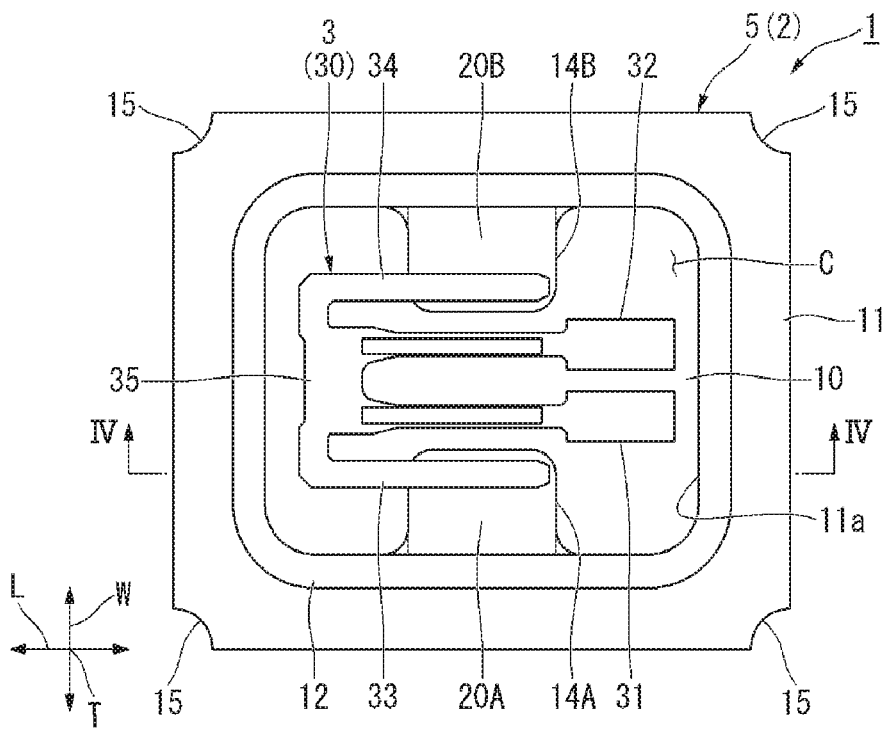
FIG. 3 is a plan view of the piezoelectric vibrator, showing a state in which a sealing plate is detached.
Figure 4:
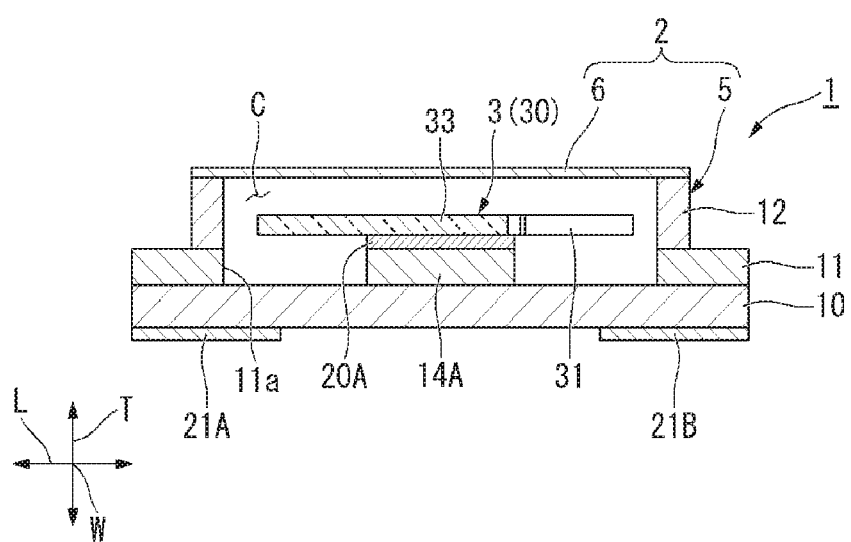
FIG. 4 is a cross-sectional view corresponding to the line IV-IV in FIG. 3.
Figure 5:
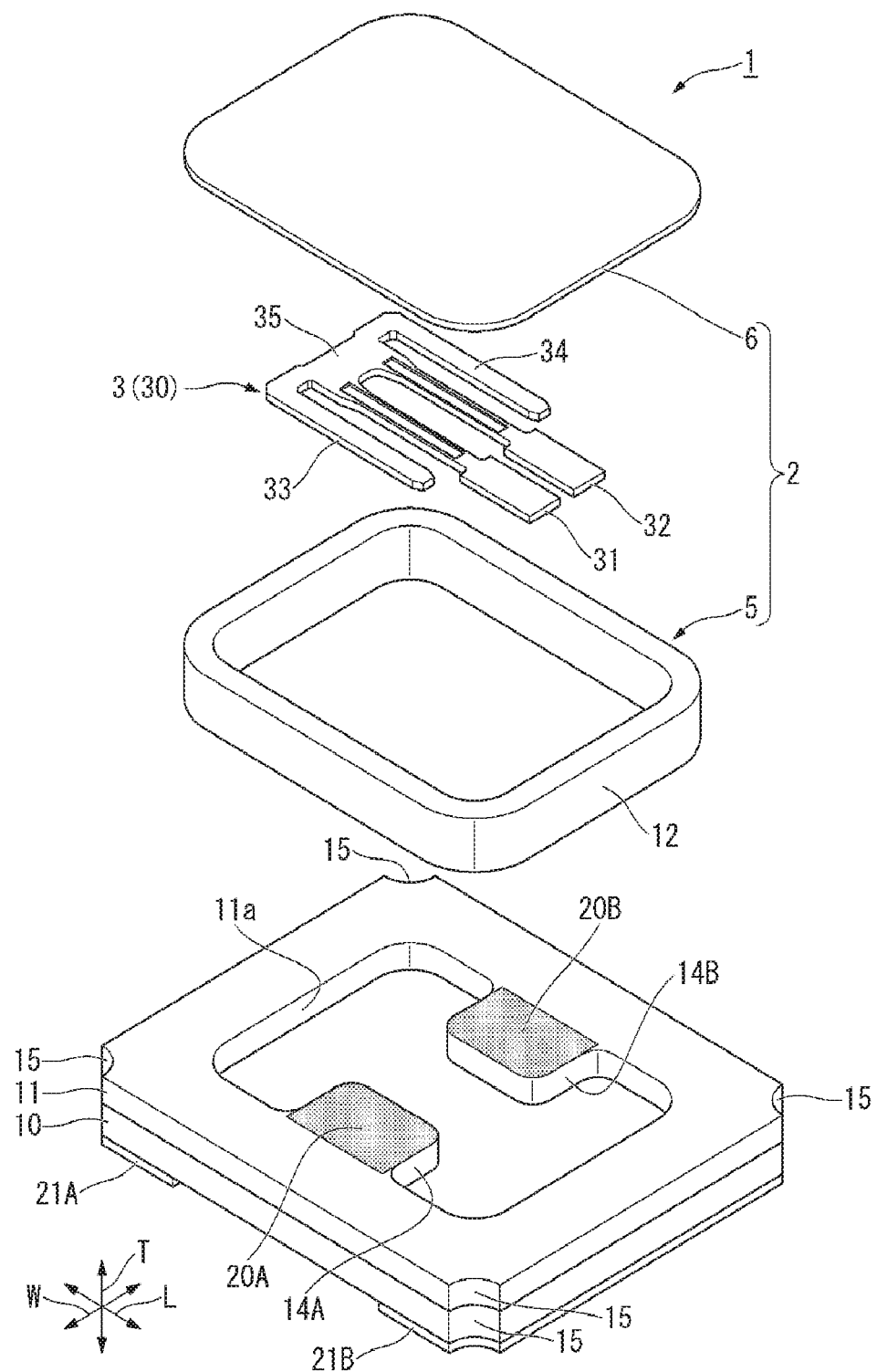
FIG. 5 is an exploded perspective view of the piezoelectric vibrator according to the embodiment.

FIG. 2 is an exterior perspective view of the piezoelectric vibrator according to the embodiment. FIG. 3 is a plan view of the piezoelectric vibrator, showing a state in which a sealing plate is detached. FIG. 4 is a cross-sectional view corresponding to the line IV-IV in FIG. 3. FIG. 5 is an exploded perspective view of the piezoelectric vibrator according to the embodiment.

As shown in FIG. 2 through FIG. 5, the piezoelectric vibrator 1 is a surface mount type vibrator of a so-called ceramic package type. The piezoelectric vibrator 1 is provided with a package 2 incorporating a cavity C sealed hermetically, and the piezoelectric vibrator element 3 housed in the cavity C. It should be noted that the piezoelectric vibrator 1 exhibits a rectangular solid shape. In the present embodiment, in the plan view, a longitudinal direction of the piezoelectric vibrator 1 is referred to as a longitudinal direction L, a direction along the shorter dimension thereof is referred to as a width direction W, and a direction perpendicular to the longitudinal direction L and the width direction W is referred to as a thickness direction T.

The package 2 is provided with a package main body 5, and a sealing plate 6 which is bonded to the package main body 5 to form the cavity C between the sealing plate 6 and the package main body 5.

The package main body 5 is provided with a first base substrate 10 and a second base substrate 11 bonded to each other in the state of being stacked on one another, and a sealing ring 12 bonded on the second base substrate 11.

As the first base substrate 10, there is used a substrate made of ceramics, and exhibiting a rectangular shape in a plan view viewed from the thickness direction T. An upper surface of the first base substrate 10 constitutes a bottom portion of the cavity C. On the lower surface of the first base substrate 10, there are formed a pair of external electrodes 21A, 21B at a distance in the longitudinal direction L. The external electrodes 21A, 21B are each formed of a single layer film made of single metal or a laminated film having different metals stacked one another formed by, for example, vapor deposition or sputtering.

The second base substrate 11 is a substrate made of ceramics having a planar shape exhibiting the same shape as that of the first base substrate 10, and is integrally bonded in a state of being stacked on the first base substrate 10 by sintering or the like. It should be noted that as the ceramic material used for each of the base substrates 10, 11, there can be used, for example, HTCC (High Temperature Co-Fired Ceramic) made of alumina, LTCC (Low Temperature Co-Fired Ceramic) made of glass ceramics, and so on.

As shown in FIG. 3 through FIG. 5, the second base substrate 11 is provided with a penetrating part 11a penetrating the second base substrate 11 in the thickness direction T. The penetrating part 11a exhibits a rectangular shape with rounded corners in the plan view. In an inner side surface of the penetrating part 11a, in portions located on both sides in the width direction W, there are formed mounting parts 14A, 14B protruding inward in the width direction W, respectively. It should be noted that the mounting parts 14A, 14B are each located in a central portion in the longitudinal direction L in the second base substrate 11.

On the mounting parts 14A, 14B, there are formed a pair of electrode pads 20A, 20B, respectively, which are connection electrodes with the piezoelectric vibrator element 3. Similarly to the external electrodes 21A, 21B described above, the electrode pads 20A, 20B are each formed of a single layer film made of single metal or a laminated film having different metals stacked one another formed by, for example, vapor deposition or sputtering. The electrode pads 20A, 20B and the external electrodes 21A, 21B are electrically coupled to each other, respectively, via respective through interconnections not shown penetrating the base substrates 10, 11 in the thickness direction T.

On the four corners of each of the base substrates 10, 11, there are formed cutout parts 15 each having a quarter-arc shape in the plan view throughout the entire length in the thickness direction T of the both base substrates 10, 11. The base substrates 10, 11 are manufactured by bonding two ceramic substrates in, for example, a wafer state so as to be stacked on one another, then forming a plurality of through holes penetrating both of the ceramic substrates so as to be arranged in a matrix, and then cutting both of the ceramic substrates in a grid manner with reference to the through holes. On this occasion, since each of the through holes is divided into four parts, the cutout parts 15 described above are formed.

The sealing ring 12 is a conductive frame-like member one size smaller than the outer shape of each of the base substrates 10, 11, and is bonded to the upper surface of the second base substrate 11. Specifically, the sealing ring 12 is bonded on the second base substrate 11 by baking with a brazing material such as silver solder, a soldering material, or the like, or bonded by fusion bonding to a metal bonding layer formed on the second base substrate 11. The sealing ring 12 constitutes the sidewall of the cavity C together with the inner side surface of the second base substrate 11 (the penetrating part 11a). It should be noted that in the illustrated example, the inner side surface of the sealing ring 12 is disposed so as to be coplanar with the inner side surface of the second base substrate 11.

As the material of the sealing ring 12, there can be cited, for example, a nickel base alloy, and specifically, it is sufficient to be selected from kovar, elinvar, invar, 42-alloy, and so on. In particular, as the material of the sealing ring 12, it is preferable to select a material closer in thermal expansion coefficient to the base substrates 10, 11 made of ceramics. For example, in the case of using alumina having the thermal expansion coefficient of $6.8 \times 10^{-6}/°$ C. as the base substrates 10, 11, kovar having the thermal expansion coefficient of $5.2 \times 10^{-6}/°$ C. or 42-alloy having the thermal expansion coefficient of 4.5 through $6.5 \times 10^{-6}/°$ C. is preferably used as the sealing ring 12.

The sealing plate 6 is formed of an electrically-conductive substrate, and is bonded on the sealing ring 12 to hermetically seal the package main body 5. Further, a space defined by the sealing ring 12, the sealing plate 6, and the base substrates 10, 11 forms the cavity C sealed hermetically.

The piezoelectric vibrator element 3 is housed in the cavity C of the package 2 sealed hermetically. The piezoelectric vibrator element 3 is provided with a piezoelectric plate 30 formed of a piezoelectric material such as a quartz crystal, lithium tantalate, or lithium niobate. The piezoelectric plate 30 has a pair of vibrating arm parts 31, 32 and a pair of support arm parts 33, 34. The piezoelectric vibrator element 3 is installed in the package 2 by the support arm parts 33, 34 being supported by the mounting parts 14A, 14B of the package 2 with the electrically-conductive adhesive inside the cavity C. Thus, the piezoelectric vibrator element 3 is supported in a state in which the vibrating arm parts 31, 32 are floating from the base substrates 10, 11 inside the cavity C. On an external surfaces of the vibrating arm parts 31, 32, there are respectively disposed two systems of excitation electrodes 41, 42 (see FIG. 6) for vibrating the pair of vibrating arm pars 31, 32 when the predetermined voltage is applied.

In order to operate the piezoelectric vibrator 1, the predetermined voltage is applied to the external electrodes 21A, 21B (see FIG. 2). Then, a current flows through the excitation electrodes 41, 42, and an electrical field is generated between the excitation electrodes 41, 42. The vibrating arm parts 31, 32 vibrate with a predetermined resonant frequency in, for example, directions (along the width direction W) of getting closer to and away from each other due to the inverse piezoelectric effect by the electrical field generated between the excitation electrodes 41, 42. Further, the vibration of the vibrating arm parts 31, 32 is used as the time source, the timing source of a control signal, the reference signal source, and so on.

(Piezoelectric Vibrator Element According to First Embodiment)

The piezoelectric vibrator element 3 according to the first embodiment will be described in detail.

Figure 6:
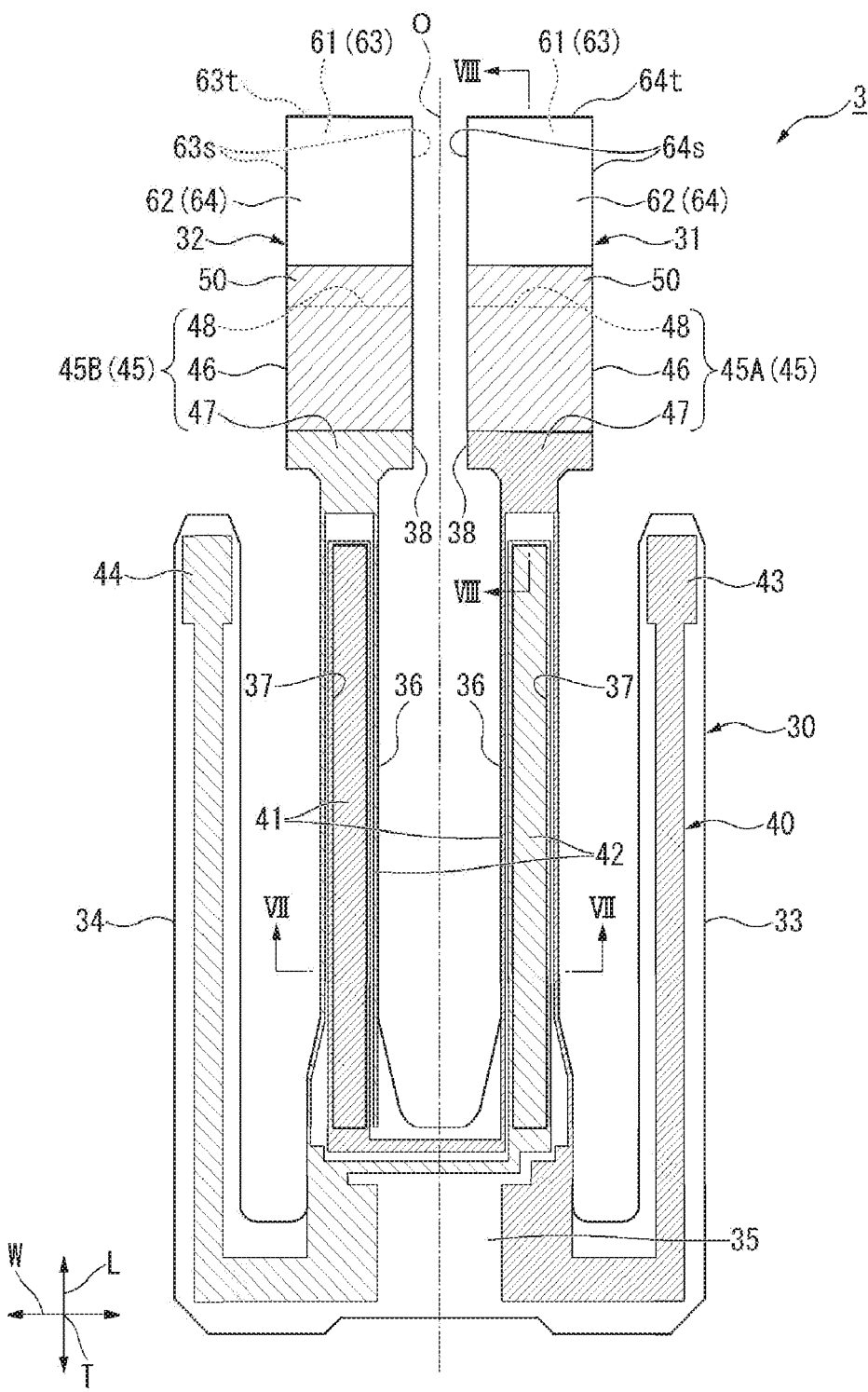
FIG. 6 is a plan view of a piezoelectric vibrator element according to a first embodiment.

FIG. 6 is the plan view of the piezoelectric vibrator element according to the first embodiment.

As shown in FIG. 6, the piezoelectric vibrator element 3 is provided with the piezoelectric plate 30, electrode films 40 disposed on an external surface including obverse and reverse surfaces of the piezoelectric plate 30, and weight metal films 50 for a frequency adjustment. It should be noted that in the present embodiment, the longitudinal direction L, the width direction W, and the thickness direction T of the piezoelectric vibrator 1 coincide with the longitudinal direction, the width direction, and the thickness direction of the piezoelectric vibrator element 3, respectively. Therefore, in the following description related to the piezoelectric vibrator element 3, there are used the longitudinal direction L, the width direction W, and the thickness direction T of the piezoelectric vibrator 1.

The piezoelectric plate 30 is provided with a base part 35, the pair of vibrating arm parts (the first vibrating arm part 31 and the second vibrating arm part 32) extending in the longitudinal direction L from the base part 30, and the pair of support arm parts (the first support arm part 33 and the second support arm part 34) located at both sides in the width direction W with respect to the base part 35. The piezoelectric plate 30 is formed so that the planar shape viewed from the thickness direction T is substantially symmetrical about the central axis O along the longitudinal direction L. It should be noted that in the description of the present embodiment, quartz crystal is cited as an example of the piezoelectric material forming the piezoelectric plate 30.

The first vibrating arm part 31 and the second vibrating arm part 32 are arranged side by side in the width direction W in parallel to each other. The vibrating arm parts 31, 32 vibrate in the directions (along the width direction W) of getting closer to and away from each other using the base end at the base end part 35 side as the fixed end, and the tip as the free end. Each of the vibrating arm parts 31, 32 has a main body part 36 extending from the base end toward the tip of corresponding one of the vibrating arm parts 31, 32, and a weight part 38 located at the tip of corresponding one of the vibrating arm parts 31, 32.

Figure 7:
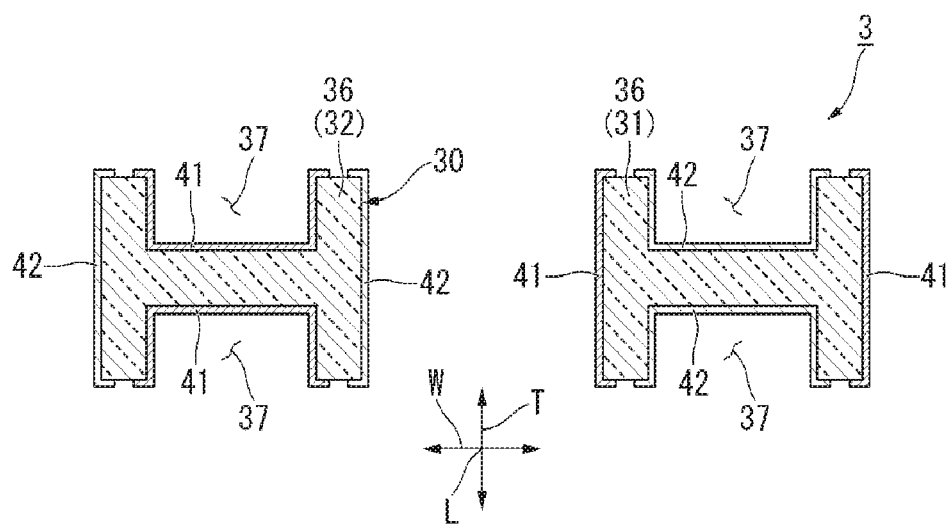
FIG. 7 is a cross-sectional view along the line VII-VII shown in FIG. 6.

FIG. 7 is a cross-sectional view along the line VII-VII in FIG. 6.

As shown in FIG. 6 and FIG. 7, the main body part 36 is provided with groove parts 37. The groove parts 37 are recessed in the thickness direction T, and at the same time extend along the longitudinal direction L on the both principal surfaces of the main body part 36. The groove parts 37 are formed continuously from the vicinity of the base end of corresponding one of the vibrating arm parts 31, 32 to the vicinity of the tip of the main body part 36.

As shown in FIG. 6, the weight parts 38 each extend in the longitudinal direction L from the tip portion of the main body part 36. The weight part 38 has a rectangular planar shape, and is formed to be wider in the width direction W than the main body part 36. Thus, it is possible to increase the mass of the tip portion of each of the vibrating arm parts 31, 32, and the inertial moment when vibrating, and it is possible to decrease the length of each of the vibrating arm parts 31, 32 compared to the piezoelectric vibrator element 3 without the weight part 38.

The support arm parts 33, 34 each exhibit an L shape in the plan view, and surround the base part 35 and the vibrating arm parts 31, 32 (the main body parts 36) from the outer sides in the width direction W. Specifically, the support arm parts 33, 34 protrude from the both end surfaces in the width direction W in the base part 35 outward in the width direction W, and then extend along the longitudinal direction L in parallel to the vibrating arm parts 31, 32, respectively. The first support arm part 33 is disposed at the same side as the first vibrating arm part 31 with respect to the central axis O. The second support arm part 34 is disposed at the same side as the second vibrating arm part 32 with respect to the central axis O.

The electrode films 40 are each a laminated film of, for example, chromium (Cr) and gold (Au), and are each formed by depositing a chromium film having high adhesiveness with quartz crystal as a foundation layer, and then stacking a gold thin film on the chromium film. It should be noted that the film configuration of the electrode films 40 is not limited to the above, and it is also possible to, for example, further stack a gold thin film on a laminated film formed of chromium and Nichrome (NiCr), or to adopt a single layer film of chromium, nickel, aluminum (Al), titanium (Ti), or the like.

The electrode films 40 are provided with the excitation electrodes 41, 42, mounting electrodes 43, 44, and coupling interconnections 45.

The two systems of excitation electrodes 41, 42 are disposed on the outer surfaces of the main body parts 36 of the vibrating arm parts 31, 32. The excitation electrodes 41, 42 are patterned so as to electrically be isolated from each other. The excitation electrodes 41, 42 consist of a first excitation electrode 41 and a second excitation electrode 42. The first excitation electrode 41 is formed on both side surfaces facing to the width direction W in the main body part 36 of the first vibrating arm part 31, and on the groove part 37 of the second vibrating arm part 32. The second excitation electrode 42 is formed on the groove part 37 of the first vibrating arm part 31, and on both side surfaces of the main body part 36 of the second vibrating arm part 32. The excitation electrodes 41, 42 vibrate the respective vibrating arm parts 31, 32 in the width direction W when a predetermined drive voltage is applied between the excitation electrodes 41, 42.

The mounting electrodes 43, 44 are disposed as a mounting part used when mounting the piezoelectric vibrator element 3 on the package 2. The mounting electrodes 43, 44 are disposed on principal surfaces (reverse surfaces) in the tip portions of the support arm parts 33, 34, respectively. Specifically, the mounting electrodes 43, 44 consist of a first mounting electrode 43 disposed on the first support arm part 33, and a second mounting electrode 44 disposed on the second support arm part 34. The first mounting electrode 43 is electrically coupled to the first excitation electrode 41. The second mounting electrode 44 is electrically coupled to the second excitation electrode 42. The mounting electrodes 43, 44 are electrically coupled to the electrode pads 20A, 20B of the package 2, respectively, via the electrically-conductive adhesive.

Coupling interconnections 45A, 45B couple the excitation electrodes 41 to each other, and couple the excitation electrodes 42 to each other at the tip side in the vibrating arm parts 31, 32, respectively. The coupling interconnections 45 consist of the first coupling interconnection 45A coupled to the first excitation electrodes 41, and the second coupling interconnection 45B coupled to the second excitation electrodes 42. The first coupling interconnection 45A electrically couples the first excitation electrodes 41 on the both side surfaces of the first vibrating arm part 31 to each other. The second coupling interconnection 45B electrically couples the second excitation electrodes 42 on the both side surfaces of the second vibrating arm part 32 to each other. The first coupling interconnection 45A and the second coupling interconnection 45B are formed similarly to each other, and are therefore described simply as the coupling interconnections 45 when the first coupling interconnection 45A and the second coupling interconnection 45B are not distinguished from each other in the following description.

The coupling interconnections 45 are each provided with a side part 46, an obverse part 47, and a reverse part 48. The side part 46 is disposed on the entire end surface of each of the vibrating arm pars 31, 32 at the tip side of the groove part 37 in each of the vibrating arm parts 31, 32. It should be noted that the end surface is a surface for coupling the principal surfaces to each other, and includes a tip surface facing to the longitudinal direction L, and side surfaces facing to the width direction W. The obverse part 47 is disposed on an obverse surface of each of the vibrating arm pars 31, 32 at the tip side of the groove part 37 in each of the vibrating arm parts 31, 32. The obverse part 47 is disposed at a distance in the longitudinal direction L from the excitation electrodes 41, 42. The obverse part 47 extends so as to straddle a boundary between the main body part 36 and the weight part 38 in each of the vibrating arm parts 31, 32. A side edge of the obverse part 47 is coupled to the side part 46. The reverse part 48 is disposed on a reverse surface of each of the vibrating arm pars 31, 32 at the tip side of the groove part 37 in each of the vibrating arm parts 31, 32. The reverse part 48 is disposed at a distance in the longitudinal direction L from the excitation electrodes 41, 42. The reverse part 48 extends so as to straddle the boundary between the main body part 36 and the weight part 38 in each of the vibrating arm parts 31, 32. A side edge of the reverse part 48 is coupled to the side part 46.

Figure 8:
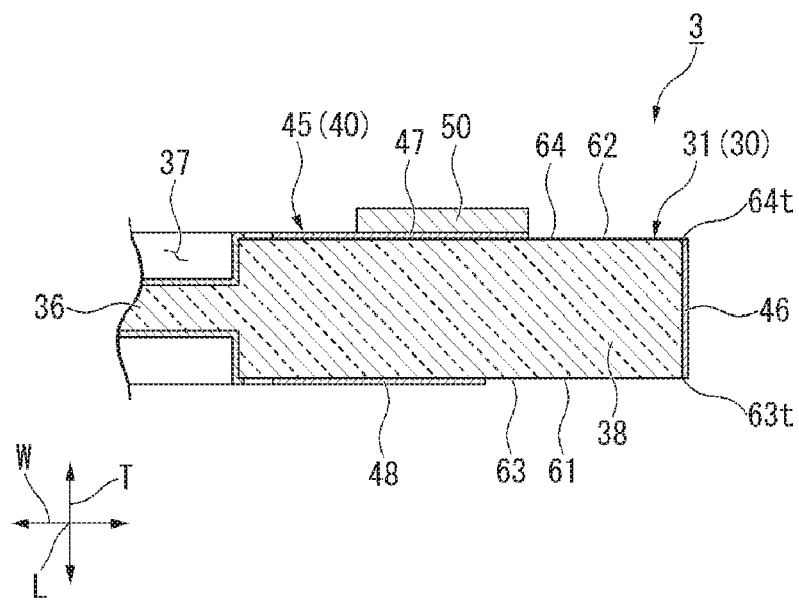
FIG. 8 is a cross-sectional view along the line VIII-VIII in FIG. 6.

FIG. 8 is a cross-sectional view along the line VIII-VIII in FIG. 6.

As shown in FIG. 6 and FIG. 8, the reverse part 48 of the coupling interconnection 45 is disposed so as to expose a part of the reverse surface 63 of each of the vibrating arm parts 31, 32. Thus, the reverse surface 63 of each of the vibrating arm parts 31, 32 has a reverse side exposure part 61 from which the piezoelectric plate 30 is exposed. The reverse side exposure part 61 is disposed only on a reverse surface of the weight part 38. The reverse side exposure part 61 is formed so as to include a tip edge 63t of the reverse surface 63 of each of the vibrating arm parts 31, 32. Further, the reverse side exposure part 61 is formed so as to include a pair of side edges 63s extending from the tip edge 63t in the reverse surface 63 of each of the vibrating arm parts 31, 32 toward the base end of corresponding one of the vibrating arm parts 31, 32. The reverse side exposure part 61 is formed to have a rectangular shape.

The weight metal film 50 is disposed on the electrode film 40 at an obverse surface 64 side of each of the vibrating arm parts 31, 32. The weight metal film 50 increases the mass in the tip part of each of the vibrating arm parts 31, 32 to suppress a rise in frequency due to the reduction of the length of corresponding one of the vibrating arm parts 31, 32. The weight metal films 50 are each made of, for example, Au or Ag, and each have a thickness of about 1 through 10 μm. The weight metal film 50 is disposed on the obverse part 47 of the coupling interconnection 45 of the electrode film 40. The weight metal film 50 is formed so that side edges at both sides in the width direction W coincide with side edges of the obverse part 47 of the coupling interconnection 45. An end edge at the base end side of each of the vibrating arm parts 31, 32 in the weight metal film 50 extends in the width direction W, and is located at the tip side of the end edge at the base end side of corresponding one of the vibrating arm parts 31, 32 in the obverse part 47 of the coupling interconnection 45. The reverse part 48 of the coupling interconnection 45 straddles the end edge at the base end side in the weight metal film 50 in the plan view.

The obverse part 47 of the coupling interconnection 45 and the weight metal film 50 are disposed so as to expose a part of the obverse surface 64 of each of the vibrating arm parts 31, 32. Thus, the obverse surface 64 of each of the vibrating arm parts 31, 32 has an obverse side exposure part 62 from which the piezoelectric plate 30 is exposed. The end edges of the obverse part 47 of the coupling interconnection 45 and the weight metal film 50 coincide with each other on the outline of the obverse side exposure part 62 in the plan view. The obverse side exposure part 62 is formed so as to include a tip edge 64t of the obverse surface 64 of each of the vibrating arm parts 31, 32. Further, the obverse side exposure part 62 is formed so as to include a pair of side edges 64s extending from the tip edge 64t in the obverse surface 64 of each of the vibrating arm parts 31, 32 toward the base end of corresponding one of the vibrating arm parts 31, 32. The whole of the obverse side exposure part 62 overlaps the reverse side exposure part 61 in the plan view. The whole of the obverse side exposure part 62 is disposed at a distance from the electrode film 40 (the reverse part 48 of the coupling interconnection 45) on the reverse surface 63 of each of the vibrating arm parts 31, 32 in the plan view.

(Method of Manufacturing Piezoelectric Vibrator Element According to First Embodiment)

A method of manufacturing the piezoelectric vibrator element 3 according to the first embodiment will be described.

Figure 9:
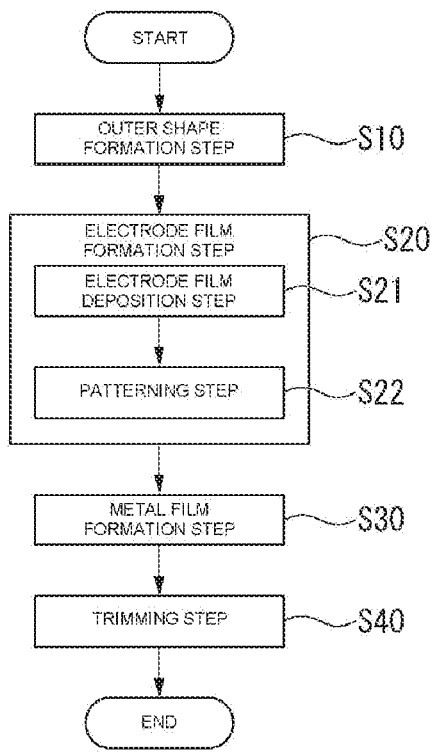
FIG. 9 is a flowchart showing a method of manufacturing the piezoelectric vibrator element according to the first embodiment.

FIG. 9 is a flowchart showing the method of manufacturing the piezoelectric vibrator element according to the first embodiment.

As shown in FIG. 9, the method of manufacturing the piezoelectric vibrator element 3 according to the first embodiment is provided with an outer shape formation step S10, an electrode film formation step S20, a metal film formation step S30, and a trimming step S40.

Firstly, the outer shape formation step S10 is performed. In the outer shape formation step S10, the piezoelectric plate 30 is formed in a wafer of a piezoelectric material. First, masks each having a shape corresponding to the planar shape of the piezoelectric plate 30 are formed on both surfaces of the wafer using a photolithography technology. Subsequently, wet-etching processing is performed on the wafer. Thus, areas which are not masked in the wafer are selectively removed to provide the wafer with the planar shape of the piezoelectric plate 30.

Subsequently, the groove parts 37 are formed on the both principal surfaces (the obverse and reverse surfaces) of each of the vibrating arm parts 31, 32. Specifically, masks each having a shape corresponding to the shape of the groove part 37 are formed on the both principal surfaces of the wafer using the photolithography technology. Then, using the wet-etching processing, half etching is performed on the wafer to the extent that the groove part 37 does not penetrate the wafer. Thus, the piezoelectric plate 30 having the groove parts 37 is formed in the wafer.

Subsequently, the electrode film formation step S20 is performed. In the electrode film formation step S20, the electrode films 40 are disposed on the obverse and reverse surfaces of the piezoelectric plate 30, and at the same time, the reverse side exposure part 61 is formed on the reverse surface of each of the vibrating arm parts 31, 32 of the piezoelectric plate 30. In the present embodiment, the electrode film formation step S20 is provided with an electrode film deposition step S21 for depositing the electrode films 40, and a patterning step S22 for patterning the electrode films 40 to form the excitation electrodes 41, 42 and the reverse side exposure part 61.

In the electrode film deposition step S21, the electrode films 40 are deposited on the obverse and reverse surfaces and the end surface of the wafer using sputtering or evaporation.

Figure 10:
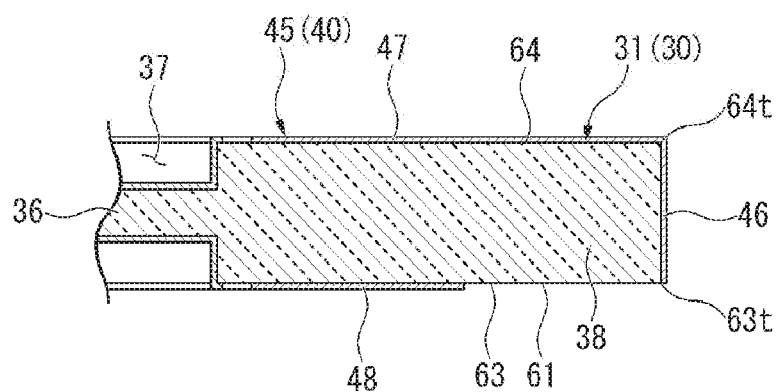
FIG. 10 is a diagram for explaining the method of manufacturing the piezoelectric vibrator element according to the first embodiment, and is a cross-sectional view corresponding to FIG. 8.

In the patterning step S22, the electrode films 40 are patterned to provide the piezoelectric plate 30 with the two systems of electrodes 41 through 44, and the coupling interconnections 45A, 45B. Firstly, a mask made of a resist material having a shape corresponding to the outline shape of the electrodes 41 through 44 and the coupling interconnections 45A, 45B is formed on the outer surfaces of the electrode films 40 using the photolithography technology. On this occasion, the mask is formed so as to cover a portion corresponding to the obverse side exposure part 62. Then, etching processing is performed on the electrode films 40 to selectively remove the electrode films 40 in the areas which are not masked. Thus, the excitation electrodes 41, 42, the mounting electrodes 43, 44, and the coupling interconnections 45A, 45B are provided to the piezoelectric plate 30. Further, as shown in FIG. 10, the reverse side exposure part 61 is formed on the reverse surface of each of the vibrating arm parts 31, 32 of the piezoelectric plate 30. It should be noted that in the present step, there is created the state in which the electrode film 40 is disposed in the portion corresponding to the obverse side exposure part 62 of each of the vibrating arm parts 31, 32 of the piezoelectric plate 30.

Figure 11:
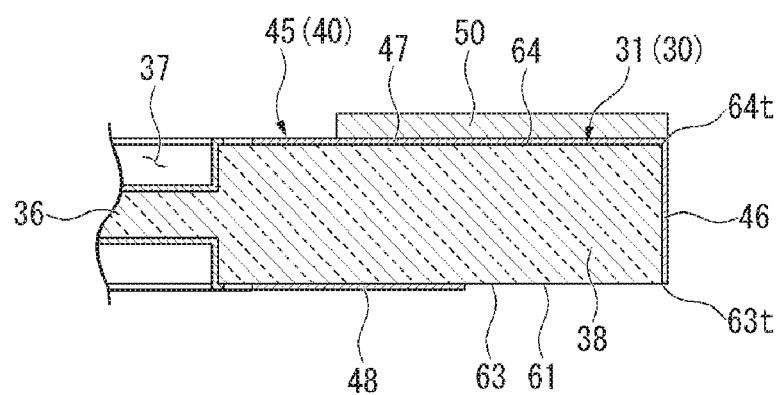
FIG. 11 is a diagram for explaining the method of manufacturing the piezoelectric vibrator element according to the first embodiment, and is a cross-sectional view corresponding to FIG. 8.

Subsequently, the metal film formation step S30 is performed. As shown in FIG. 11, in the metal film formation step S30, the weight metal film 50 for the frequency adjustment is formed on the electrode film 40 at the obverse surface 64 side of each of the vibrating arm parts 31, 32. On this occasion, the weight metal film 50 is deposited so that at least a part of the weight metal film 50 overlaps the reverse side exposure part 61 in the plan view. The weight metal films 50 can be formed by, for example, evaporation using a metal mask.

Subsequently, the trimming step S40 is performed. In the trimming step S40, coarse adjustment of the resonance frequency is performed on each of the piezoelectric vibrator elements 3. In the trimming step S40, the weight metal film 50 is partially removed (trimmed) together with the electrode film 40 (the obverse part 47 of the coupling interconnection 45) as a lower layer of the weight metal film 50 from the obverse surface 64 of each of the vibrating arm parts 31, 32 in accordance with the adjustment amount of the resonance frequency. In the trimming step S40, the weight metal film 50 and the electrode film 40 are removed using a pulsed laser. As the pulsed laser, a picosecond laser and a femtosecond second laser are favorable, and the picosecond laser is perfect.

In the trimming step S40, the weight metal film 50 is irradiated with the laser beam from the obverse surface side to thereby melt and then remove the irradiated portion of the weight metal film 50 together with the electrode film 40 located immediately below the irradiated portion. On this occasion, the weight metal film 50 and the electrode film 40 are removed by the laser within the range overlapping the reverse side exposure part 61 in the plan view, and at a distance from the electrode film 40 on the reverse surface 63 at the obverse surface 64 side of each of the vibrating arm parts 31, 32. By adjusting the irradiation range with the laser beam in accordance with the adjustment amount of the resonance frequency, the reverse side exposure part 61 described above is formed. Then, in accordance with a change in inertial moment of each of the vibrating arm parts 31, 32 due to the trimming of the weight metal film 50, the frequency of corresponding one of the vibrating arm parts 31, 32 varies.

As described hereinabove, the piezoelectric vibrator element 3 according to the present embodiment is provided with the electrode films 40 disposed on the obverse and reverse surfaces of the piezoelectric plate 30, and the weight metal films 50 for a frequency adjustment disposed on the electrode films 40 at the obverse surface 64 side in the vibrating arm parts 31, 32. The reverse surface 63 of each of the vibrating arm parts 31, 32 has the reverse side exposure part 61 from which the piezoelectric plate 30 is exposed. The obverse surface 64 of each of the vibrating arm parts 31, 32 has the obverse side exposure part 62 from which the weight metal film 50 and the electrode film 40 are removed, and from which the piezoelectric plate 30 is exposed. Further, the whole of the obverse side exposure part 62 overlaps the reverse side exposure part 61 at a distance from the electrode film 40 (the reverse part 48 of the coupling interconnection 45) on the reverse surface 63 of each of the vibrating arm parts 31, 32 in the plan view. According to this configuration, the laser beam transmitted through the piezoelectric plate 30 passes through the reverse side exposure part 61 when the obverse side exposure part 62 is formed in the process of removing the weight metal film 50 together with the electrode film 40 as the lower layer of the weight metal film 50 using the laser as the frequency adjustment. Therefore, since electrode film 40 on the reverse surface 63 of the piezoelectric plate 30 is not irradiated with the laser beam, it is possible to prevent the burr from occurring in the electrode film 40 at the reverse surface 63 side. Therefore, it is possible to prevent the fluctuation of the frequency due to the separation or the deformation of the burr of the electrode film 40. Therefore, it is possible to provide the piezoelectric vibrator element 3 which is excellent in vibration characteristics, high in quality, and capable of suppressing the fluctuation of the frequency after the frequency adjustment.

Further, the electrode film 40 has the side part 46 of the coupling interconnection 45 disposed on the end surface of each of the vibrating arm parts 31, 32 on the periphery of the obverse side exposure part 62. Although the weight metal film 50 can be formed so as to warp around the end surface of each of the vibrating arm parts 31, 32 when depositing the weight metal film 50, according to this configuration, the side part 46 of the coupling interconnection 45 functions as a foundation of the weight metal film 50 to enhance the adhesiveness of the weight metal film 50 compared to when the end surface of the corresponding one of the vibrating arm parts 31, 32 is exposed. Therefore, it is possible to prevent the separation of the weight metal film 50. Therefore, it is possible to prevent the fluctuation of the frequency due to the separation of the weight metal film 50. Therefore, the fluctuation of the frequency after the frequency adjustment can be suppressed.

Further, the reverse side exposure part 61 includes the tip edge 63t and the side edge 63s on the reverse surface 63 of each of the vibrating arm parts 31, 32. When the reverse side exposure part 61 does not supposedly include the tip edge 63t and the side edge 63s of the reverse surface 63, the entire outline of the reverse side exposure part 61 coincides with the end edge of the electrode film 40 on the reverse surface 63. In this case, it is necessary to remove the weight metal film 50 located inside the outline of the reverse side exposure part 61 in the plan view and at the obverse surface 64 side. In the present embodiment, in the portion of the outline of the reverse side exposure part 61 coinciding with the tip edge 63t and the side edge 63s of the reverse surface 63, the end edge of the electrode film 40 on the reverse surface 63 does not exist. Therefore, even when the weight metal film 50 on the tip edge 64t and the side edge 64s of the obverse surface 64 is removed, it is possible to prevent the electrode film 40 on the reverse surface 63 from being irradiated with the laser beam transmitted therethrough. Therefore, it becomes possible to increase the proportion of the area of the obverse side exposure part 62 to the area of the reverse side exposure part 61 compared to when the reverse side exposure part 61 does not include the tip edge 63t and the side edge 63s of the reverse surface 63. Therefore, it is possible to set the adjustment range of the frequency wider. Further, since it is possible to remove the weight metal film 50 in sequence from the tip toward the base end of each of the vibrating arm parts 31, 32, it is possible to efficiently perform the frequency adjustment.

Further, the reverse part 48 of the coupling interconnection 45 straddles the end edge at the base end side of each of the vibrating arm parts 31, 32 in the weight metal film 50 in the plan view. According to this configuration, in the piezoelectric vibrator element 3 having the excitation electrodes 41, 42 disposed at the base end side of the weight metal film 50, it is possible to form the coupling interconnection 45 coupled to the excitation electrodes 41, 42 using the electrode film 40 so as to overlap the weight metal film 50 in the plan view. Therefore, even when the proportion of the range occupied by the weight metal film 50 increases as the piezoelectric vibrator element 3 is reduced in size, it is possible to surely form the coupling interconnection 45 to ensure the reliability.

In the method of manufacturing the piezoelectric vibrator element 3 according to the present embodiment, the weight metal film 50 and the electrode film 40 are removed by the laser within the range overlapping the reverse side exposure part 61 in the plan view, and at a distance from the electrode film 40 on the reverse surface 63 at the obverse surface 64 side of each of the vibrating arm parts 31, 32 in the trimming step S40. Thus, since the laser beam transmitted through the piezoelectric plate 30 passes through the reverse side exposure part 61 in the trimming step, it is possible to prevent the electrode film 40 at the reverse surface 63 side from being irradiated with the laser beam to form the burr. Therefore, it is possible to prevent the fluctuation of the frequency due to the separation or the deformation of the burr of the electrode film 40. Therefore, it is possible to manufacture the piezoelectric vibrator element 3 which is excellent in vibration characteristics, high in quality, and capable of suppressing the fluctuation of the frequency after the frequency adjustment.

In the trimming step S40, there is used the picosecond laser or the femtosecond laser. Thus, unlike the case of using the nanosecond laser, it is possible to prevent the burr from being formed in the electrode film 40 and the weight metal film 50 at the obverse surface 64 side.

The electrode film formation step S20 is provided with the electrode film deposition step S21 for depositing the electrode films 40, and the patterning step S22 for patterning the electrode films 40 to form the excitation electrodes 41, 42 and the reverse side exposure part 61. Thus, it is possible to form the reverse side exposure part 61 with substantially the same processing accuracy as that of the excitation electrodes 41, 42. Further, since the step for forming the reverse side exposure part 61 is not added to the related-art manufacturing method, it is possible to suppress a rise in manufacturing cost.

Further, since the piezoelectric vibrator 1 and the oscillator 100 according to the present embodiment have the piezoelectric vibrator element 3 described above, it is possible to realize the piezoelectric vibrator 1 and the oscillator 100 which are excellent in operation reliability and high in quality.

It should be noted that in the embodiment described above, the reverse side exposure part 61 is formed in the patterning step S22, but the method of forming the reverse side exposure part 61 is not limited thereto. In the electrode film formation step, it is possible to deposit the electrode film 40 in the state in which a part of the reverse surface 63 of each of the vibrating arm parts 31, 32 is masked, and to use the part thus masked as the reverse side exposure part 61. According to this method, it is possible to form the reverse side exposure part 61 when depositing the electrode films 40. Therefore, since the step for forming the reverse side exposure part 61 is not added to the related-art manufacturing method, it is possible to suppress a rise in manufacturing cost.

Second Embodiment

Then, a second embodiment will be described with reference to FIG. 12 and FIG. 13. In the first embodiment, the obverse side exposure part 62 is formed so as to include the tip edge 64t of the obverse surface 64 of each of the vibrating arm parts 31, 32. In contrast, in the second embodiment, an obverse side exposure part 62A is formed at the base end side of the tip edge 64t of the obverse surface 64 of each of the vibrating arm parts 31, 32, which is different from the obverse side exposure part 62 in the first embodiment. It should be noted that the configuration except a part described hereinafter is substantially the same as in the first embodiment.

Figure 12:
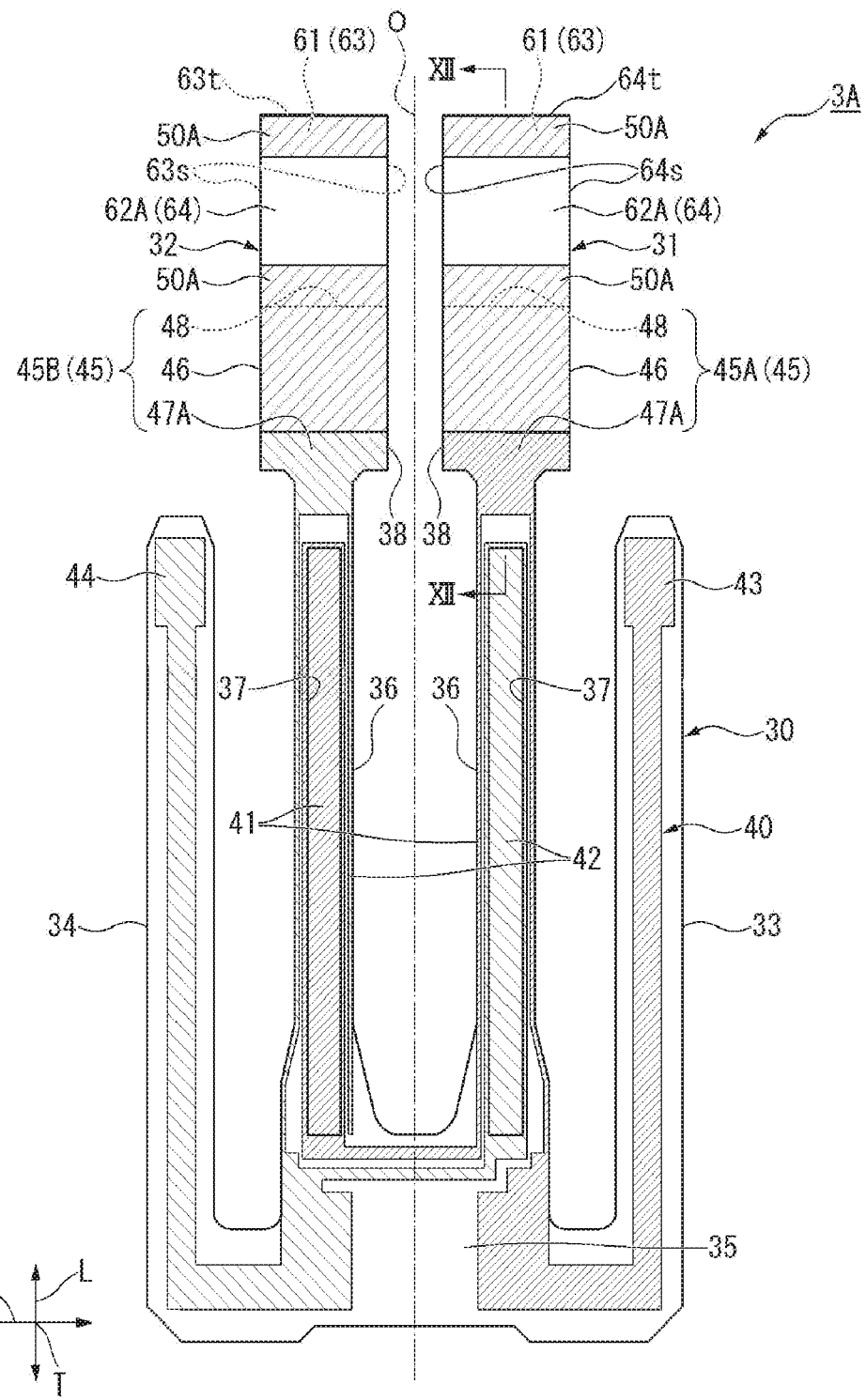
FIG. 12 is a plan view of a piezoelectric vibrator element according to a second embodiment.

FIG. 12 is a plan view of a piezoelectric vibrator element according to the second embodiment. FIG. 13 is a cross-sectional view along the XIII-XIII line in FIG. 12.

Figure 13:
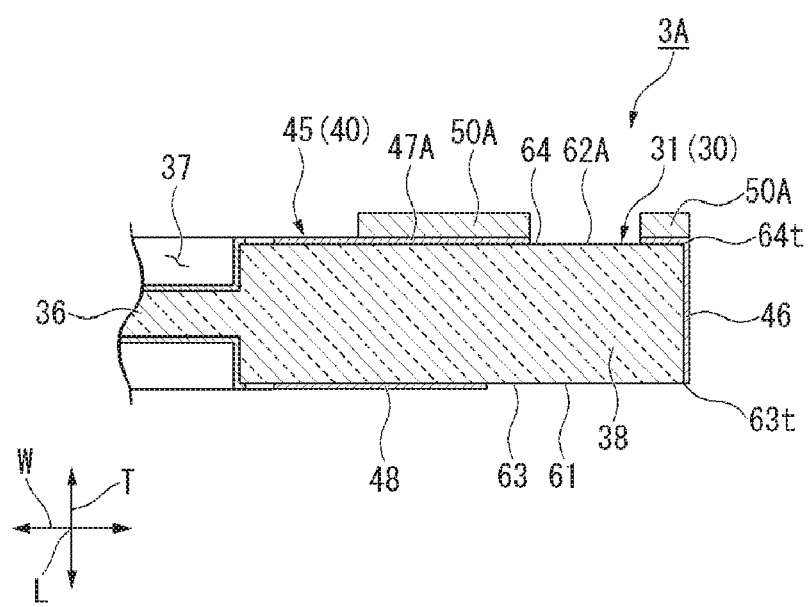
FIG. 13 is a cross-sectional view along the XIII-XIII line in FIG. 12.

As shown in FIG. 12 and FIG. 13, the obverse side exposure part 62A is formed so as to include only an intermediate portion of each of the pair of side edges 64s in the obverse surface 64 of each of the vibrating arm parts 31, 32. Thus, an obverse part 47A of the coupling interconnection 45 covers the tip edge 64t of the obverse surface 64 of each of the vibrating arm parts 31, 32, and is coupled to the side part 46 on the tip edge 64t of the obverse surface 64. A weight metal film 50A is disposed at the both sides in the longitudinal direction L across the obverse side exposure part 62A, and on the obverse part 47A of the coupling interconnection 45. The end edges of the obverse part 47A of the coupling interconnection 45 and the weight metal film 50A coincide with each other on the outline of the obverse side exposure part 62A in the plan view. Also in the present embodiment, the whole of the obverse side exposure part 62A overlaps the reverse side exposure part 61 at a distance from the electrode film 40 on the reverse surface 63 of each of the vibrating arm parts 31, 32 in the plan view.

As described hereinabove, in the present embodiment, the whole of the obverse side exposure part 62A overlaps the reverse side exposure part 61 at a distance from the electrode film 40 on the reverse surface 63 of each of the vibrating arm parts 31, 32 in the plan view. Therefore, according to the piezoelectric vibrator element 3A related to the present embodiment, it is possible to exert substantially the same functions and advantages as in the first embodiment.

It should be noted that the present disclosure is not limited to the above embodiments described with reference to the drawings, but a variety of modified examples can be cited within the technical scope or the spirit of the present disclosure.

For example, in the example described above, the piezoelectric vibrator element 3 is a so-!called side-arm vibrator element having the support arm parts 33, 34 disposed at the outer side of the respective vibrating arms 31, 32. However, this configuration is not a limitation, but the piezoelectric vibrator element can also be, for example, a so-!called center-arm vibrator element having a single support arm part disposed between the pair of vibrating arm parts, or a vibrator element not provided with any support arm part. Further, it is also possible to adopt a configuration in which each of the vibrating arm parts is not provided with the groove part. Further, it is also possible to adopt a configuration in which each of the vibrating arm parts is not provided with the weight part.

Further, although the end edge along the obverse side exposure part 62, 62A in the weight metal film 50, 50A extends linearly in the width direction W in the examples shown in FIG. 6 and FIG. 12, the shape of the end edge is not limited thereto. For example, the end edge along the obverse side exposure part in the weight metal film can extend to form a recessed shape so as to be recessed toward the inside of the weight metal film.

Further, in the embodiments described above, the reverse part 48 of the coupling interconnection 45 straddles the end edge at the base end side in the weight metal film 50 in the plan view. However, the whole of the reverse part of the coupling interconnection can be disposed at the base end side of the weight metal film 50 in the plan view.

Besides the above, it is arbitrarily possible to replace the constituent in the embodiments described above with a known constituent within the scope or the spirit of the present disclosure.

What is claimed is:
1. A piezoelectric vibrator element comprising:
a piezoelectric plate having a pair of vibrating arm parts;
an electrode film disposed on obverse and reverse surfaces of the piezoelectric plate; and a weight metal film for a frequency adjustment disposed at an obverse surface side in the vibrating arm part, and on the electrode film, wherein:

a reverse surface of the vibrating arm part has a reverse side exposure part from which the piezoelectric plate is exposed, the reverse side exposure part having a first length along a longitudinal direction, the obverse surface of the vibrating arm part has an obverse side exposure part from which the weight metal film and the electrode film are removed, and from which the piezoelectric plate is exposed, the obverse side exposure part having a second length along a longitudinal direction, a whole of the obverse side exposure part overlaps a portion of the reverse side exposure part at a distance from the electrode film on the reverse surface viewed from a thickness direction of the piezoelectric plate, wherein the first length is equal to a summation of the second length and the distance, and the distance is shorter than a length of the weight metal film.

2. The piezoelectric vibrator element according to claim 1, wherein the electrode film is disposed on an end surface of the vibrating arm part on a periphery of the obverse side exposure part.

3. The piezoelectric vibrator element according to claim 2, wherein the reverse surface of the vibrating arm part is provided with a tip edge at a tip side in the vibrating arm part, and a pair of side edges extending from the tip edge toward a base end of the vibrating arm part, and the reverse side exposure part includes the tip edge and the side edges in the reverse surface of the vibrating arm part.

4. The piezoelectric vibrator element according to claim 2, wherein a portion disposed on the reverse surface of the vibrating arm part out of the electrode film straddles an end edge at the base end side in the vibrating arm part in the weight metal film viewed from the thickness direction.

5. The piezoelectric vibrator element according to claim 2, wherein the reverse surface of the vibrating arm part is provided with a tip edge at a tip side in the vibrating arm part, and a pair of side edges extending from the tip edge toward a base end of the vibrating arm part, the reverse side exposure part includes the tip edge and the side edges in the reverse surface of the vibrating arm part, and a portion disposed on the reverse surface of the vibrating arm part out of the electrode film straddles an end edge at the base end side in the vibrating arm part in the weight metal film viewed from the thickness direction.

6. The piezoelectric vibrator element according to claim 1, wherein the reverse surface of the vibrating arm part is provided with a tip edge at a tip side in the vibrating arm part, and a pair of side edges extending from the tip edge toward a base end of the vibrating arm part, and the reverse side exposure part includes the tip edge and the side edges in the reverse surface of the vibrating arm part.

7. The piezoelectric vibrator element according to claim 1, wherein a portion disposed on the reverse surface of the vibrating arm part out of the electrode film straddles an end edge at the base end side in the vibrating arm part in the weight metal film viewed from the thickness direction.

8. A piezoelectric vibrator comprising:

the piezoelectric vibrator element according to claim 1; and a package configured to airtightly seal the piezoelectric vibrator element.

9. An oscillator comprising:

the piezoelectric vibrator according to claim 8, wherein the piezoelectric vibrator is electrically coupled to an integrated circuit as an oscillator.

10. The piezoelectric vibrator element according to claim 1, wherein a portion of the weight metal film overlaps a whole of the distance viewed from a thickness direction of the piezoelectric plate.

11. The piezoelectric vibrator element according to claim 1, wherein a portion of the weight metal film overlaps a portion of the electrode film on the reverse surface viewed from a thickness direction of the piezoelectric plate.

\* \* \* \* \*